United States Patent
Bendernagel et al.

(10) Patent No.: US 6,800,518 B2
(45) Date of Patent: Oct. 5, 2004

(54) FORMATION OF PATTERNED SILICON-ON-INSULATOR (SOI)/SILICON-ON-NOTHING (SON) COMPOSITE STRUCTURE BY POROUS SI ENGINEERING

(75) Inventors: Robert E. Bendernagel, Hopewell Junction, NY (US); Kwang Su Choe, Mount Kisco, NY (US); Bijan Davari, Mahopac, NY (US); Keith E. Fogel, Mohegan Lake, NY (US); Devendra K. Sadana, Pleasantville, NY (US); Ghavam G. Shahidi, Pound Ridge, NY (US); Sandip Tiwari, Ithaca, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/334,220

(22) Filed: Dec. 30, 2002

(65) Prior Publication Data

US 2004/0126985 A1 Jul. 1, 2004

(51) Int. Cl.[7] .......................................... H01L 31/8234
(52) U.S. Cl. ...................... 438/207; 438/149; 438/162; 438/423; 257/347; 257/506
(58) Field of Search .................................. 438/149, 162, 438/151, 207, 218, 404, 405, 409, 411, 422, 423, 442; 257/347, 506

(56) References Cited

U.S. PATENT DOCUMENTS 6,630,714 B2 * 10/2003 Sato et al. .................. 257/350
2003/0119228 A1 * 6/2003 Oyamatsu .................... 438/149
2003/0201512 A1 * 10/2003 Yamada et al. ............. 257/510

* cited by examiner

Primary Examiner—Caridad Everhart
(74) Attorney, Agent, or Firm—Scully, Scott, Murphy & Presser; Robert M. Trepp (57) ABSTRACT

A patterned SOI/SON composite structure and methods of forming the same are provided. In the SOI/SON composite structure, the patterned SOI/SON structures are sandwiched between a Si over-layer and a semiconductor substrate. The method of forming the patterned SOI/SON composite structure includes shared processing steps wherein the SOI and SON structure are formed together. The present invention also provides a method of forming a composite structure which includes buried conductive/SON structures as well as a method of forming a composite structure including only buried void planes.

38 Claims, 4 Drawing Sheets

FORMATION OF PATTERNED SILICON-ON-INSULATOR (SOI)/SILICON-ON-NOTHING (SON) COMPOSITE STRUCTURE BY POROUS SI ENGINEERING

DESCRIPTION

1. Field of the Invention

The present invention relates to a semiconductor composite structure, and more particular to a semiconductor composite structure which includes a combination of a silicon-on-insulator (SOI) structure, wherein a thin silicon layer, i.e., a Si over-layer, is separated from the substrate by an insulating region, and a silicon-on-nothing (SON) structure, where the Si over-layer is separated from the substrate by an extended void plane or air gap. The present invention also relates to methods for forming the aforementioned semiconductor composite structure.

2. Background of the Invention

In microelectronic integrated circuit (IC) fabrication, SOI and SON wafers are used in instances where a particular IC requires that the active device regions be separated and isolated from the underlying semiconductor substrate. When the active device regions, which are relatively small in physical dimensions and volume, are kept in contact with the substrate, which is vastly larger in volume, various effects deleterious to the device and circuit performance are observed. For example, the following effects may be observed: increased leakage current and junction capacitance, reduced resistance to effects of radiation and heat, increased short-channel effects, and increased vulnerability to electrical disruption called latch-up. In all, these deleterious effects translate to loss of device and circuit performance and the increase in power consumption.

The SOI and SON devices and circuits, by virtue of the unique semiconductor material structure on which they are built, are essentially immune from the above-mentioned effects and are thus in great demand.

In SOI, a continuous layer of buried insulating material such as an oxide is formed between a Si over-layer and a semiconductor substrate. The buried insulating material serves to electrically isolate the Si over-layer from the substrate. In a proven method referred to as bond-and-etch-back SOI (BESOI), this is achieved by oxidizing two starting semiconductor wafers on the surface, bonding the two wafers at the oxidized surfaces, and then reducing one wafer to a thin over-layer by etching it down from the backside and polishing the etched wafer to provide a smooth surface that is suitable for device fabrication. Since the wafer surfaces are oxidized to a desired depth prior to bonding, very good control of the buried oxide formation can be maintained. Hence, the resulting buried oxide is very uniform and can have nearly any desired thickness. However, trapping of impurities at the bonded interface and the difficulty in achieving a thin, uniform Si over-layer through etch-back process are major weaknesses of prior art BESOI processes.

In another proven method called SIMOX (separation by ion implantation of oxygen), oxygen ions are implanted directly into a wafer surface and then the implanted oxygen ions are reacted with Si atoms to form a buried oxide layer upon annealing at a high temperature. The depth, thickness, and uniformity of the buried oxide layer is primarily dependent on the dose and energy of the implanted oxygen and the subsequent annealing conditions. Generally, SIMOX processes provide buried oxides and a Si over-layer that are uniform and are of high-quality.

In yet another proven method called FIPOS (full isolation by porous oxidized silicon), a patterned Si surface is anodized in a HF-containing solution to form porous Si fully surrounding unanodized Si islands. In this method, the Si islands are patterned and converted to a type resistant to anodization prior to insertion into the solution. As the porous Si oxidizes so much faster than bulk Si, due to its vastly increased surface area, it fully surrounds and isolates the Si islands upon thermal oxidation. This prior art method is regarded as a very inexpensive way of forming SOI. However, it is generally difficult to form thin and yet very dense thermal oxides with this prior art method. Moreover, the Si islands may suffer from dislocations and stacking faults, if it is stressed by the surrounding oxidized porous Si.

In SON, an extended void plane or air gap is formed underneath the Si over-layer surface. By necessity, however, the buried void plane is finite in lateral dimension, as the Si over-layer and the semiconductor substrate below would separate if the void plane were to extend to the full diameter of the semiconductor wafer. Usually, buried void planes of limited size are formed at select locations on the wafer.

In a further proven prior art method referred to as empty space in silicon (ESS), elongated etch-pits are formed on the wafer surface and are transformed into a buried void plane by annealing in a hydrogen ambient at elevated temperatures, which induce the surface migration of Si atoms. The area and thickness of the buried void plane and the Si over-layer above are determined by the width and depth of the individual etch-pits as well as the pitch and the number of the etch-pits.

In yet another further proven method, a SiGe layer is deposited on a semiconductor wafer surface by selective epitaxial growth, a Si bridge is formed above the SiGe layer, and then the SiGe layer is selectively etched away, leaving an air gap. In this prior art method, the whole procedure is incorporated as a part of the device fabrication process.

As the known prior art methods for fabricating SOI and SON composites are quite different, and because the former involves buried oxide and the latter a void, it has not been practical so far to combine the two composite structures on a single semiconductor wafer. In terms of low-power device isolation, the SON composite is far superior in that the dielectric constant of a void typically approaches 1, the lowest possible dielectric constant, while the dielectric constant of a typically buried oxide such as $SiO_2$ is about 3.9.

In addition to device isolation, however, the buried insulating region, if properly patterned, can perform additional function as a back-gate dielectric, while the SON can be used as a compliant substrate for lattice-mismatched epitaxial layers, such as SiGe and GaAs. Thus, a SOI/SON composite combination may not only improve the microelectronic applications that currently utilize the SOI and SON separately, but also the composite combination may be useful in many new applications that are not presently known or yet realized.

SUMMARY OF THE INVENTION

The present invention provides a method to form a patterned SOI/SON composite structure on a single semiconductor wafer by a shared process. A key feature of the inventive shared process is the formation of a porous Si layer by electrolytic anodization in a HF-containing solution. In some prior art SOI methods, porous Si is used as a sacrificial etch-stop, a splitting plane, a field oxide region or a full-isolation oxide region. In the present invention, however, the porous Si is uniquely utilized in forming a buried insulating/void combination.

As such, a principal objective of the present invention is to provide a semiconductor composite structure that includes a patterned SOI/SON structure. The composite structure may include single or multiple levels of SOI and SON structures. In the present invention, the patterned SOI/SON structures, in a given layer, are formed adjacent to each other, in an alternating pattern of SOI and SON.

Another objective of the present invention is to provide a method to fabricate such SOI/SON-containing composites.

A further objective of the present invention is to provide a method to fabricate such SOI/SON-containing composites that includes processing steps that are mostly shared by both SOI and SON structures.

A still further objective of the present invention is that the SOI/SON structural pattern is not fixed, but can be formed in any desired shape and size.

In accordance with one aspect of the present invention, a semiconductor composite structure, which includes a combination of patterned SOI and SON structures, is provided. Specifically, the inventive semiconductor composite structure comprises:

a semiconductor substrate;

one or more layers of patterned buried insulating regions and void planes located next to each other and atop the semiconductor substrate; and a Si over-layer of a predetermined thickness located atop the one or more layers of patterned buried insulating regions and void planes.

In one embodiment of the present invention, the buried insulating regions of the inventive semiconductor composite structure are replaced with a buried conductive region. In another embodiment of the present invention, the inventive semiconductor composite structure includes only void planes. In yet another embodiment of the present invention, the inventive semiconductor composite structure includes buried insulating regions, buried conductive regions, and void planes.

In accordance with another aspect of the present invention, a method of forming the above-mentioned semiconductor composite structure is provided. Specifically, the method of the present invention comprises the steps of:

(a) forming a layer of porous Si in a surface region of a semiconductor wafer;

(b) forming an epi-Si layer on the layer of porous Si, wherein an interface exists between the epi-Si layer and the layer of porous Si;

(c) selectively implanting ions into predetermined areas of the wafer to form implant regions at or near said interface; and (d) annealing the wafer at an elevated temperature which causes transformation of the implant regions, by reaction with the surrounding layer of porous Si, into buried insulating regions, and transformation of unimplanted porous Si, by pore coalescence, into buried void planes.

In some embodiments of the present invention wherein multilayers of vertically stacked buried insulating/void planes are formed, steps (a)–(c) are repeated any number of times prior to performing annealing step (d).

In accordance with the present invention, the porous Si layer is formed by utilizing electrolytic anodization that is performed in a HF-containing solution. In HF-anodization, the porosity of the porous Si formed is mainly dependent on the current and voltage used, the HF concentration, and the doping type and concentration of the semiconductor wafer. The thickness of the porous Si layer, in addition, depends on the time of the anodization process.

A brief anneal in a hydrogen ambient at an elevated temperature may be employed after step (a), if necessary, to eliminate open pores on the surface of the porous Si layer. In yet another embodiment, an optional hydrogen anneal is also performed after annealing step (d).

In some embodiments, a patterned mask of silicon dioxide, silicon nitride, photoresist or a combination thereof may be employed to selectively form the implant regions in the wafer. In such an embodiment, the patterned mask has a sufficient thickness that prevents ions from being implanted into the regions of the structure where void planes are to be formed.

In an alternative method of the present invention, the ions that are implanted are capable of forming a buried conductive region upon annealing. In such an embodiment, metal ions are implanted and the buried conductive regions include metal silicides.

In a yet further alternative method of the present invention, a composite structure including buried void planes only is provided. This method of the present invention comprises the steps of:

(i) forming a patterned mask of HF-resistant material, e.g., photoresist, atop a semiconductor wafer, said patterned mask having one or more openings that expose portions of said semiconductor wafer;

(ii) forming porous Si in surface regions of said exposed portions of said semiconductor wafer;

(iii) removing said patterned mask;

(iv) forming epi-Si atop the wafer including said porous Si; and (v) annealing the wafer at an elevated temperature which causes transformation of the porous Si, by pore coalescence, into buried void planes.

In another alternative method of the present invention, a semiconductor composite structure containing buried layers of insulator/void plane structures side-by-side, conductor/void plane structures side-by-side, and void plane structures alone is provided by repeating steps (a)–(c) and steps (i)–(iv) of the aforementioned methods any number of times prior to performing the final anneal step which cause the above-mentioned transformations.

DETAILED DESCRIPTION OF THE INVENTION

The present invention, which provides patterned SOI/SON composite structures and methods of fabricating the same, will now be described in more detail by referring to the drawings that accompany the present application. In the accompanying drawings, like reference numerals are used in describing like and corresponding elements.

Due to distinct differences in the process features in the prior art, the integration of SOI and SON onto a single semiconductor wafer is not common. The merit of the present invention is to lay-out the SOI and SON structures side-by-side in any desired pattern on a single semiconductor wafer in a shared fabrication process. The term "semiconductor wafer" is used herein to denote a wafer that includes a semiconducting material such as Si, SiGe, SiC, SiGeC, GaAs, GeAs, InAs, InP and other like III/V compound semiconductors. The term "semiconductor wafer" may also include a silicon-on-insulator substrate.

Figure 1:
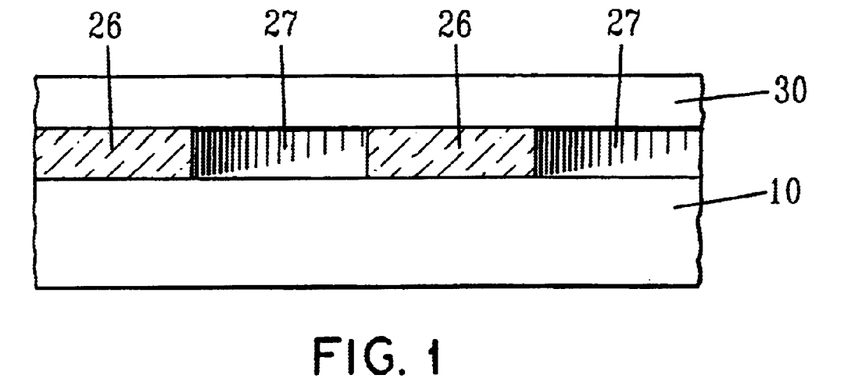
FIG. 1 is a pictorial representation (through a cross-sectional view) showing the inventive patterned SOI/SON composite structure of the present invention. A single layer of patterned SOI and SON is shown.

FIG. 1 illustrates the cross-sectional view of a typical patterned SOI/SON composite structure that can be fabricated using one of the methods of the present invention. The patterned SOI/SON composite structure shown in FIG. 1 includes a single layer of buried insulating regions 26 and void planes 27 sandwiched between Si over-layer 30 and semiconductor wafer or substrate 10. Note that buried insulating regions 26 lay side-by-side with void planes 27. Thus, the inventive composite structure contains a layer of alternating buried insulating regions (SOI) and void planes (SON) in a single semiconductor substrate.

The thickness of the various layers of the inventive patterned SOI/SON composite structure may vary depending on the process conditions that are employed in fabricating the structure. Typically, the layer of buried insulating regions and void planes has a thickness of from about 5 nm to about 1 $\mu$m, with a thickness of from about 5 to about 200 nm being more highly preferred. The thickness of the layer of buried insulating regions and void planes is dependent on the device requirement and could be controlled in the present invention mainly by adjusting the vertical depth of the porous Si layer formed during HF-anodization and the dose of the implanted ions.

Si over-layer 30 has a monocrystalline structure, and the thickness of layer 30 is typically from about 2 nm to about 1 $\mu$m, with a thickness of from about 2 to about 100 nm being more preferred. The thickness of the Si over-layer is dependent on the device requirement and could be controlled in the present invention by the Si epi deposition and the Si consumption during thermal annealing. The thickness of substrate 10 is inconsequential to the present invention. The layer of patterned SOI/SON structures is substantially uniform and the various SOI/SON structures are of highquality.

In some embodiments of the present invention, buried insulating regions 26 are replaced by a buried conductive region. In such an embodiment, a patterned buried conductive/SON composite structure is provided. Such a composite structure will look like the structure shown in FIG. 1 above, or FIG. 2 below, with the exception that buried insulating regions 26 are replaced with a buried conductive material.

Figure 2:
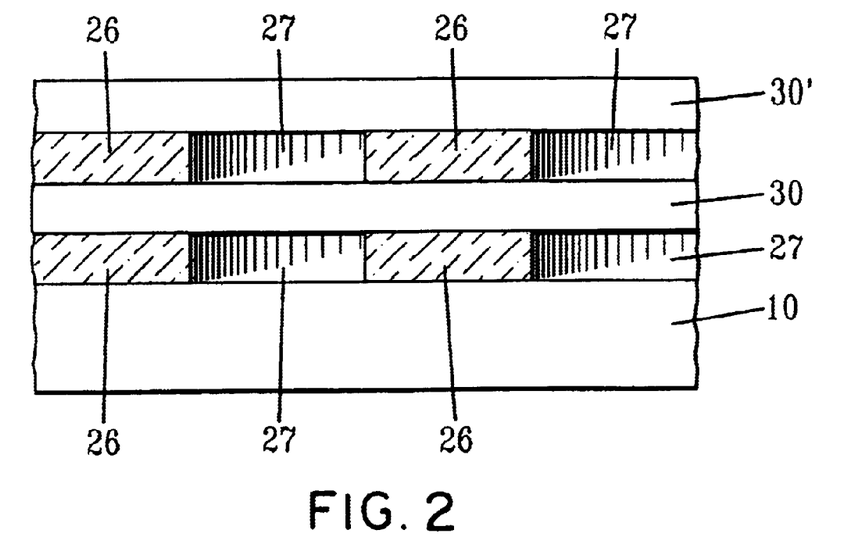
FIG. 2 is a pictorial representation (through a cross-sectional view) showing the inventive patterned SOI/SON composite structure of the present invention. Multiple layers of patterned SOI and SON are shown.

FIG. 2 shows a patterned SOI/SON composite structure of the present invention that includes multiple layers of buried insulating regions 26 and void planes 27, where each of the multiple layers could be uniquely patterned and different from the layers above and below. The bottom most layer of the structure is substrate 10, whereas the top most layer of the illustrated structure is Si over-layer 30'. Although the present invention illustrates patterned SOI/SON composite structures containing one and two layers of patterned buried insulating regions and void planes, respectively, the present invention contemplates forming a plurality of such patterned SOI/SON layers in a single composite structure.

In FIG. 2, the two buried SOI/SON layers (26 and 27) need not be aligned and they may not be of identical design. For sake of clarity, however, FIG. 2 shows the two buried SOI/SON layers aligned and of identical design dimensions. Despite the given illustration, the present invention contemplates misaligned buried SOI/SON layer where each buried region has its own design dimension.

The inventive processing steps employed in fabricating the patterned SOI/SON composite structures shown in FIGS. 1 and 2 will now be described in more detail. Reference is first made to the structure shown in FIG. 3A. Specifically, the structure shown in FIG. 3A comprises semiconductor wafer or substrate 10 having a layer of porous Si 12 in a surface region thereof. The terms "wafer" and "substrate" are interchangeably used in the present application. The semiconductor wafer is typically a Si-containing semiconductor material of any desired size. The semiconductor wafer needs to be doped, preferably, but not necessarily, with p-type doping atoms. When a boron-doped p-type wafer is employed, the dopant concentration of the wafer is typically from about 1E15 to about 1E19 atoms/cm$^3$, with a dopant concentration of from about 5E17 to about 1E19 atoms/cm$^3$ being more highly preferred.

Figure 3A:
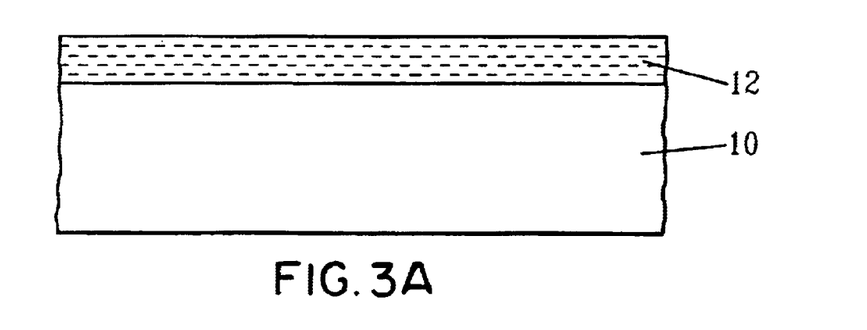
FIGS. 3A–3D are pictorial representations (through cross-sectional views) illustrating the basic processing steps of the present invention that are used in forming the structure shown in FIG. 1. In these drawings, the processing steps up to, but not including, the annealing step is shown.

The porous Si layer 12 is a thin layer having a thickness from about 100 nm to about 2 $\mu$m, with a thickness from about 500 nm to about 1 $\mu$m being more highly preferred. The porosity of porous Si layer 12 is from about 5 to about 70%, with a porosity of from about 10 to about 40% being more highly preferred. The porous Si layer is typically formed at or below the upper surface region of semiconductor wafer 10.

Porous Si layer 12 is formed utilizing an anodization technique that is performed in a HF-containing solution. The term "HF-containing solution" denotes a mixture of HF and an electrolyte such as hydrocarbons, alcohols, water and the like. The preferred electrolyte employed in the present invention is concentrated HF (49 wt % HF+51 wt % H$_2$O). The anozidation process is performed in a-HF containing bath in which the wafer is immersed and biased positively. The bath also includes an electrode that is biased negatively.

HF-anodization is a widely known and generally accepted technique of forming porous Si and other porous semiconductors, such as, for example, Ge and GaAs. By appropriate experimentation involving various HF concentrations, current and voltage levels, doping type (n- or p-type) and dopant concentration in the wafer and anodization time, a recipe of anodization parameters suitable for a specific desired porous layer structure can be found. Any known anodization apparatus can be employed in the present invention in forming the porous Si layer, so long as if is designed to allow a flow of electrical current in uniform density all throughout the surface area of wafer.

In accordance with the present invention, and to achieve the above mentioned porosity, the HF-anodization is carried out using a HF concentration, in 100% electrolyte, of from about 25 to about 50 wt %, with a concentration of HF, in 100% electrolyte, of from about 40 to about 50 wt % being more highly preferred. As anodization is driven by electrical current flow, the current is normally set constant at a desired density value during anodization. The constant current density employed during the anodization process is from about 0.1 to about 20 mA/cm$^2$, with an anodization current from about 1 to about 2 mA/cm$^2$ being more highly preferred.

Depending on the type and doping density of the Si wafer, the voltage that is required to drive the current densities during anodization is typically from about 0.1 to about 10 volts, with a voltage from about 0.5 to about 5 volts being more highly preferred. Anodization is typically performed at about room temperature, for a time period from about 30 seconds to about 10 minutes, with a time period from about 1 to about 5 minutes being more highly preferred.

After anodization, the structure containing the porous Si layer may optionally be briefly annealed in a hydrogen ambient at elevated temperatures to substantially eliminate open pores on the porous Si surface. Specifically, the optional hydrogen anneal is performed at a temperature from about 800° to about 1100° C. for a time period of about 10 minutes to about 2 hours. More specifically, the optional hydrogen anneal is performed at a temperature from about 850° to about 900° C. for a time period of about 30 minutes to about 1 hour. The hydrogen anneal is normally performed utilizing pure 100% hydrogen. But, if needed, it may be admixed with an inert gas such as He, Ar, Xe or a mixture thereof. The amount of hydrogen within the gas admixture is typically from about 50 to about 100%. The pressure of hydrogen used during this optional pre-annealing step is typically from about 10 to about 760 Torr.

Hydrogen annealing is known for inducing surface migration of Si atoms that lead to the substantial elimination of open surface pores. At elevated temperatures, however, the pores in the bulk coalesce into larger pores to minimize the surface energy. Therefore, the hydrogen annealing process, if utilized in the present invention, should not be carried out for a long duration and too high a temperature.

Figure 3B:
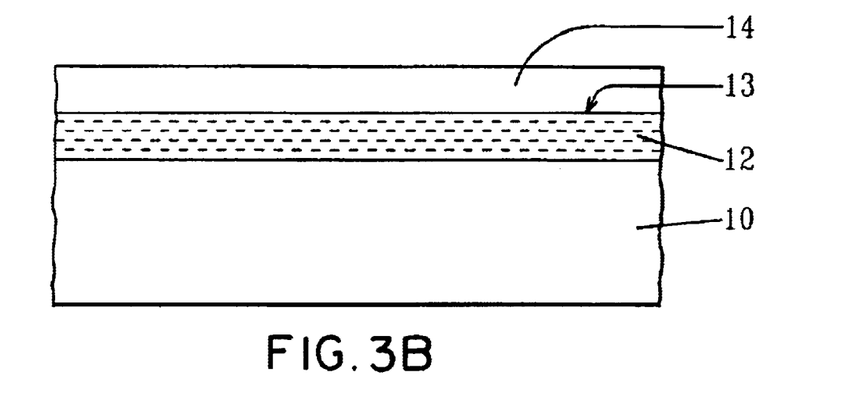

Next, and as shown in FIG. 3B, epi-Si layer 14 is formed atop porous Si layer 12 utilizing a deposition method that is capable of growing a low-defect epi-Si layer. Illustrative examples of suitable deposition methods that can be employed in the present invention include, but are not limited to: chemical vapor deposition (CVD), plasma-assisted CVD, molecular beam epitaxial deposition, and the like. The thickness of the epi-Si layer, which typically has a monocrystalline structure, is from of about 100 nm to about 1 µm, with a thickness of from about 400 to about 600 nm being more highly preferred. Note that interface 13 exists between the porous Si layer and epi-Si layer 14.

Figure 3C:
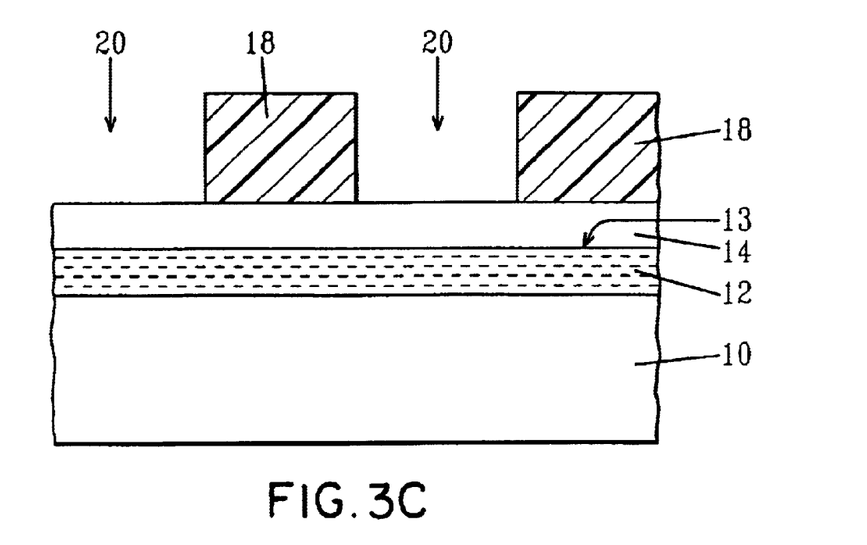

In one embodiment of the present invention, a conventional masking material of silicon oxide, silicon nitride, photoresist or any combination thereof may now be applied to an upper surface of epi-Si layer 14 utilizing a conventional deposition process such as low-temperature CVD, spin-on coating, and the like, and thereafter conventional lithography is used in providing patterned mask 18 having one or more openings 20 which expose the underlying surface of epi-Si layer 14. The resultant structure including the patterned mask and the one or more openings is shown, for example, in FIG. 3C. Note that cross-sectional rectangular patterns are typically formed during this step of the present invention. The lithography step includes depositing photoresist, in the case of silicon dioxide and silicon nitride, exposing the photoresist to a pattern of radiation and developing the exposed photoresist utilizing a conventional resist developer.

Figure 3D:
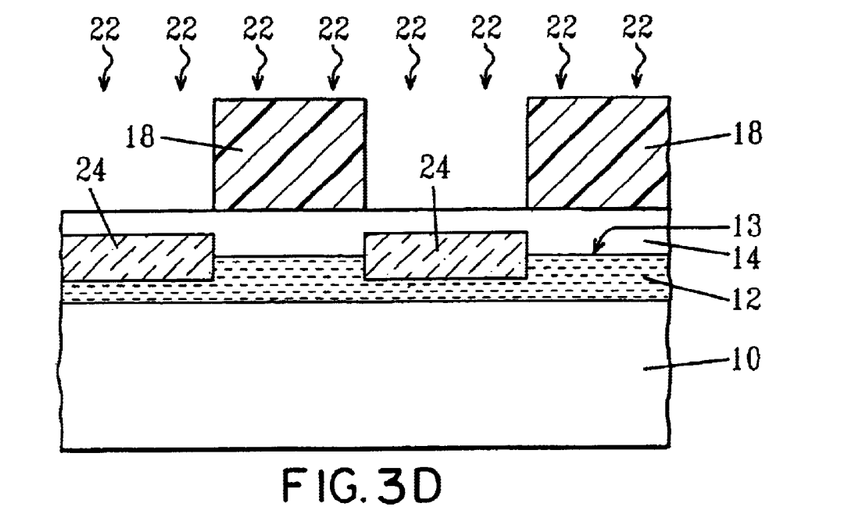

The thickness of the patterned mask may vary so as long as it is capable of preventing (i.e., blocking) ions from being implanted into the blocked regions during the subsequent ion implant step. Typically, the thickness of the mask is at least about 500 nm or greater, with a thickness of from about 1 to about 3 µm being more highly preferred Next, and as shown in FIG. 3D, oxygen ions 22 are uniformly implanted into the structure through openings 20 forming oxygen implant regions 24 at or near interface 13. More specifically, the oxygen implant regions are formed such that the peak concentration of the implant is at or slightly below the epi-Si/porous Si interface. It is noted that in areas where the patterned mask is present, the implanted oxygen ions are stopped within the patterned mask and do not penetrate into the underlying epi-Si layer. Conversely, the implanted oxygen ions penetrate into the structure in areas where no mask is present.

The oxygen implant may be formed utilizing any conventional ion implantation apparatus and any conventional ion implantation conditions may be employed in the present invention. For example, the oxygen ion implant may be performed utilizing an oxygen ion dose from about 1E16 to about 2E18 atoms/cm$^2$, an implant energy from about 50 KeV to about 10 MeV, an ion beam current density from about 0.05 to about 500 mA/cm$^2$, and an implantation temperature from about 480° to about 650° C. More preferably, the oxygen ion implant may be performed utilizing an oxygen ion dose from about 5E16 to about 2E17 atoms/cm$^2$, an implant energy from about 150 to about 300 KeV, an ion beam current density from about 1.0 to about 10 mA/cm$^2$, and an implantation temperature from about 550° to about 600° C. Other ion implantation conditions besides those specifically mentioned above are also contemplated herein. This high temperature implant step is followed by a normal room temperature implant as described, for example, in U.S. Pat. Nos. 5,930,643; 6,043,166 and 6,090,689, the disclosures of which are incorporated herein by reference.

The oxygen ion may be implanted in a single step, or multiple ion implantation steps may be employed. The implant may be a continuous implant or a pulsed implant may also be employed. In another embodiment of the present invention, the oxygen ions are replaced with nitrogen ions or a combination of oxygen and nitrogen ions that are capable of forming a buried insulating region in the structure upon performing the subsequent high-temperature annealing process. The implantation of nitrogen ions is performed utilizing any ion implantation process, including implant conditions, that are well known to those skilled in the art.

In one alternative embodiment of the present invention, the ions that are implanted are metal ions such as Mo, Ta, W and other like refractory metals which have an eutectic temperature higher than about 1300° C. when alloyed with Si. These metal ions are capable of forming a buried conductive region when subjected to the subsequent high-temperature annealing process to be described in greater detail herein below. In this embodiment, a layer containing alternating buried conductive regions and void planes would be formed.

After the implant step, the patterned mask is typically removed from the surface of the structure utilizing a conventional stripping process that is well known to those skilled in the art. In other embodiments, the patterned mask is not removed until after the annealing process has been performed. It is preferred in the present invention, however, that the patterned mask be removed prior to the annealing step.

Annealing is now performed so as to provide the structure shown, for example, in FIG. 1. Specifically, the annealing step employed at this point of the present invention is a high-temperature anneal which is capable of transforming implanted oxygen regions 24 into buried oxide regions 26, while the regions that do not contain oxygen ions are transformed into void planes 26. The layer above regions 26 and 27 is Si over-layer 30. When other ions besides oxygen are employed, buried insulating regions are formed instead of buried oxide regions. When conductive ions are employed, buried conductive regions are formed instead of the buried oxide regions.

In this buried oxide/void formation, the porous Si is consumed and the epi-Si layer may be thinned by surface oxidation, resulting in a much thinner Si over-layer 30 than the original epi-Si layer, when surface oxide is stripped off. In some embodiments, not shown, the surface oxide remains on the composite structure.

In accordance with the present invention, the buried insulating regions (as well as the buried conductive regions) are formed by the thermal interaction between the implanted ions and the porous Si. The void planes are formed by pore coalescence. The term "void planes" denotes gaps wherein nothing, but air, is present between the Si over-layer and the substrate.

The high-temperature annealing is performed at a temperature of about 1300° C. or greater, but less than the melting point of Si which is 1415° C., for a time period of about 2 hours or greater. More preferably, the high-temperature annealing step is performed at a temperature of from about 1300° to about 1350° C. for a time period of from about 5 to about 10 hours. The high-temperature annealing may be carried out in 100% pure oxygen, oxygen admixed with an inert gas or $N_2$ or both just an inert gas or $N_2$ or their mixture, or in vacuum. When an oxygen-containing admixture is employed, the oxygen is typically present in a concentration from about 0.25 to about 99.75%, with an oxygen concentration from about 2 to about 25% being more highly preferred. The remainder of the admixture, up to 100%, is the inert gas or $N_2$ or both.

The annealing step may be formed utilizing a continuous heating regime wherein a single ramp-up rate and cool down rate is employed. Alternatively, the high-temperature annealing step may include various ramp-up rates, soaks and cool down rates.

During the high-temperature annealing step, dopants present in substrate 10 may diffuse from substrate 10 into Si over-layer 30. If the level of doping concentration in Si over-layer 30 is too high, for a given device application, the structure shown in FIG. 1 may be subjected to a post hydrogen annealing process. The post hydrogen anneal includes the same or different conditions as that of the optional hydrogen anneal mentioned above. A preferred post hydrogen anneal that may be employed in the present invention is a 0.25–3 hour anneal in low-pressure (80 Torr or less) hydrogen ambient at 1100°–1150° C.

In some embodiments of the present invention, the processing steps as outlined in FIGS. 3A–3D above may be repeated prior to performing the high-temperature anneal to provide the structure shown, for example, in FIG. 2.

In yet another embodiment of the present invention, the void planes provided above may be filled with a gas, liquid or solid utilizing processing steps that are well known to those skilled in the art. The gas is other than air.

In yet another alternative embodiment of the present invention, the steps of applying a mask and patterning the mask may be eliminated. In this instance, a selective ion implantation process wherein ions are implanted only into predetermined areas of the structure may be used.

In yet a further alternative embodiment of the present invention, the HF-anodization step is replaced with processes which form vacancies or voids instead of pores.

In an alternative method of the present invention, buried voids planes only are formed into a semiconductor wafer. This alternative method of the present invention is depicted in FIGS. 4A–4D.

Figure 4A:
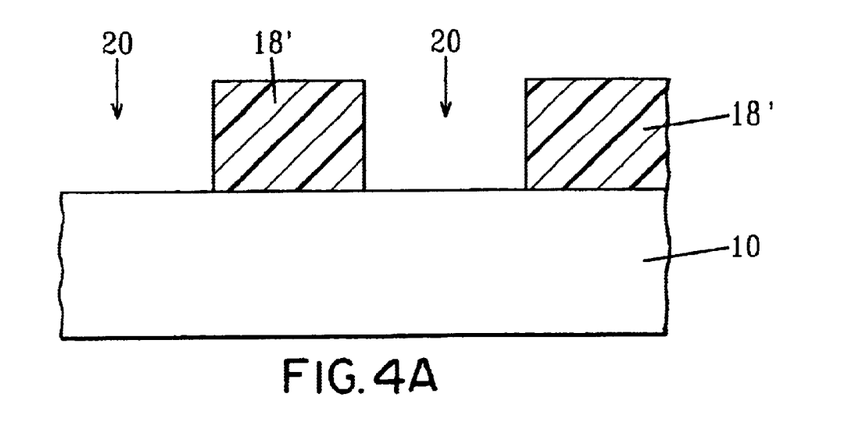
FIGS. 4A–4D are pictorial representations (through cross-sectional views) illustrating an alternative method of the present invention.

FIG. 4A illustrates the structure after patterned mask of HF-resistant photoresist 18' is formed atop a surface of semiconductor wafer 10. The patterned photoresist is formed utilizing the processing steps mentioned above. As shown, patterned photoresist 18' has one or more openings 20 that expose portions of the semiconductor wafer.

Figure 4B:
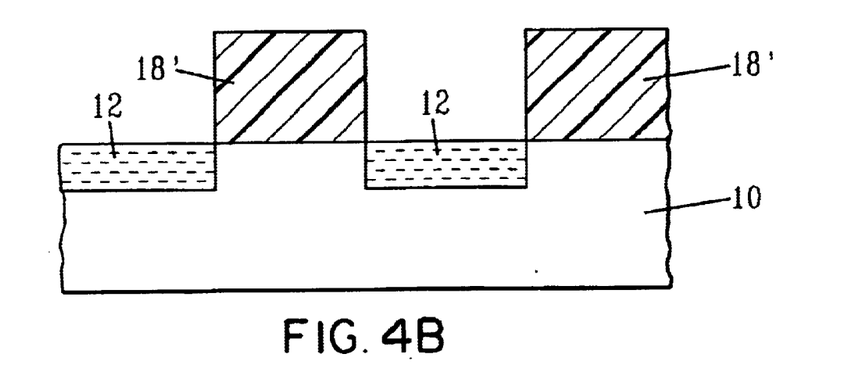

Next, and as shown in FIG. 4B, porous Si regions 12 are formed in the exposed portions of the semiconductor wafer utilizing the HF-anodization process mentioned above and thereafter the patterned photoresist is stripped, and epi-Si 14 is formed atop the entire structure including the porous Si regions 12 forming interface 13 with the porous Si regions; See FIG. 4C. The epi-Si is formed utilizing one of the deposition processes mentioned above.

Figure 4C:
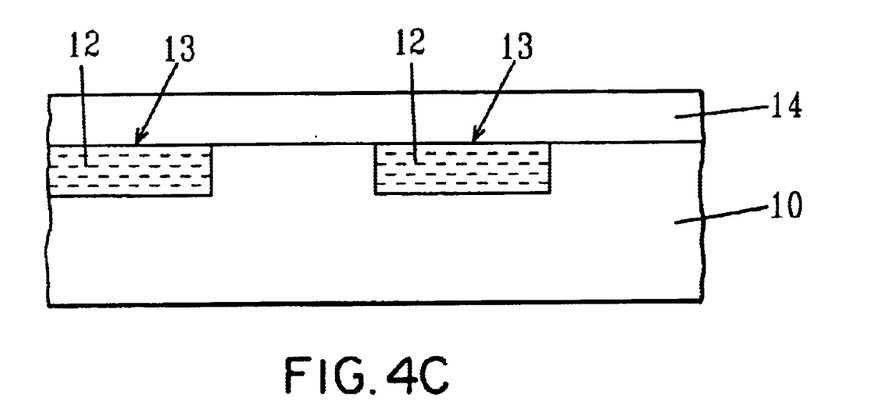
Figure 4D:
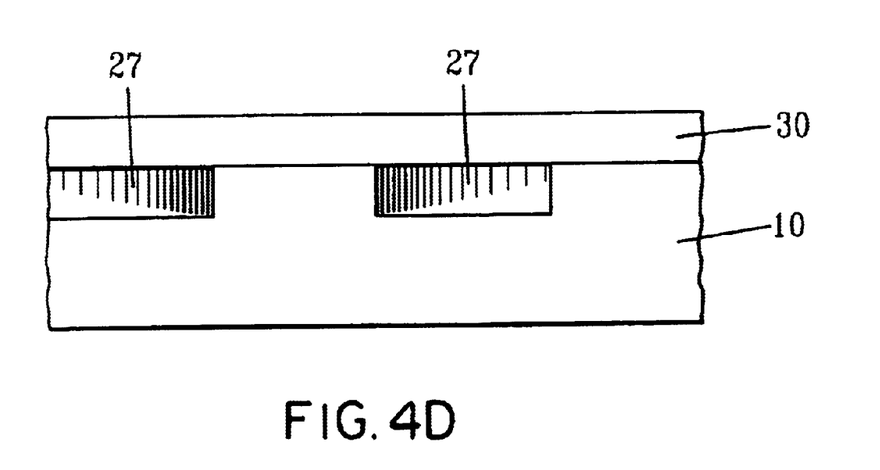

The structure shown in FIG. 4C is then annealed at an elevated temperature which causes transformation of the porous Si, by pore coalescence, into buried void planes 27. The high-temperature anneal includes the conditions mentioned above. The resultant structure is shown, for example, in FIG. 4D. The void planes may be filled with a gas, liquid or solid as mentioned above. Multiple layers of void planes may also be formed by repeating the processing steps shown in FIG. 4A–4C prior to annealing.

In an additional embodiment of the present invention, the processing steps as outlined in FIGS. 3A–3D and FIGS. 4A–4C above may be repeated any number of times prior to performing the high-temperature anneal to provide a semiconductor composite structure containing all the buried insulating regions, conductive regions, and void planes.

Where it is possible, the buried insulating regions, conductive regions, and void planes in FIG. 2 may be connected to each other and to the surface by vias. The vias may be filled with an insulating or conductive material or simply left as a void. The methods and processing steps of forming via holes and filling them with an insulating or conductive material are well known to those skilled in the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A semiconductor composite structure comprising:
   a semiconductor substrate;
   one or more layers of patterned buried insulating regions and void planes located next to each other and atop the semiconductor substrate; and
   a Si over-layer of a predetermined thickness located atop the one or more layers of patterned buried insulating regions and void planes.

2. The semiconductor composite structure of claim 1 wherein said Si over-layer has a monocrystalline structure.

3. The semiconductor composite structure of claim 1 wherein said Si over-layer has a thickness of from about 2 nm to about 1 $\mu$m.

4. The semiconductor composite structure of claim 1 wherein said buried insulating regions are buried oxide regions.

5. The semiconductor substrate structure of claim 1 wherein said one or more layers of buried insulating regions and void planes each have a thickness of from about 5 nm to about 1 µm.

6. The semiconductor composite structure of claim 1 wherein said void planes are filled with a liquid.

7. The semiconductor composite structure of claim 1 wherein said void planes are filled with a gas.

8. The semiconductor composite structure of claim 1 wherein said void planes are filled with a solid.

9. The semiconductor composite structure of claim 1 wherein said semiconductor substrate is a Si-containing substrate.

10. The semiconductor composite structure of claim 1 wherein said semiconductor substrate is doped.

11. The semiconductor composite structure of claim 1 wherein said Si over-layer is doped.

12. The semiconductor composite structure of claim 1 further comprising a surface oxide located atop said Si over-layer.

13. A semiconductor composite structure comprising:
   a semiconductor substrate;
   one or more layers of patterned buried conductive regions and void planes located next to each other and atop the semiconductor substrate; and
   a Si over-layer of a predetermined thickness located atop the one or more layers of patterned buried conductive regions and void planes.

14. A method of forming a semiconductor composite structure containing buried SOI/SON structures side-by-side, said method comprising the steps of:
   (a) forming a layer of porous Si in a surface region of a semiconductor wafer,
   (b) forming an epi-Si layer on the layer of porous Si, wherein an interface exists between the epi-Si layer and the layer of porous Si;
   (c) selectively implanting ions into predetermined areas of the wafer to form implant regions at or near said interface; and
   (d) annealing the wafer at an elevated temperature which causes transformation of the implant regions, by reaction with the surrounding layer of porous Si, into buried insulating regions, and transformation of unimplanted porous Si, by pore coalescence, into buried void planes.

15. The method of claim 14 further comprising performing a hydrogen annealing step between steps (a) and (b) to substantially eliminate open surface pores in said porous Si layer.

16. The method of claim 15 wherein said hydrogen annealing is performed at a temperature of from about 800° to about 1100° C. for a time period of from about 10 minutes to about 2 hours.

17. The method of claim 15 wherein said hydrogen annealing is performed in pure 100% hydrogen or that is admixed with an inert gas.

18. The method of claim 14 wherein said porous Si layer is formed by electrolytic anodization in a HF-containing bath.

19. The method of claim 18 wherein said HF-containing bath includes an electrolyte.

20. The method of claim 19 wherein said bath comprising from about 25 to about 50 wt % HF in 100% electrolyte.

21. The method of claim 18 wherein said electrolytic anodization is performed using a constant anodization current density of from about 0.1 to about 20 mA/cm$^2$.

22. The method of claim 18 wherein said electrolytic anodization is performed at a voltage of from about 0.5 to about 10 volts.

23. The method of claim 18 wherein said electrolytic anodization is performed at room temperature for a time period of from about 30 seconds to about 10 minutes.

24. The method of claim 14 wherein said epi-Si layer is formed by a deposition process that is capable of growing a low-defect epi-Si layer.

25. The method of claim 14 wherein said selective ion implantation includes the use of a patterned mask that is formed atop portions of said epi-Si layer.

26. The method of claim 14 wherein said selective ion implanting comprises oxygen ion implantation.

27. The method of claim 14 wherein said selective ion implanting comprises ion implanting of nitrogen, a combination of nitrogen and oxygen or a conductive metal.

28. The method of claim 26 wherein said oxygen ion implantation is performed using an oxygen ion dose of from about 1E16 to about 2E18 atoms/cm$^2$.

29. The method of claim 26 wherein said oxygen ion implantation is performed at an implant energy of from about 50 KeV to about 10 MeV.

30. The method of claim 26 wherein said oxygen ion implantation is performed using a ion beam current density of from about 0.05 to about 500 mA/cm$^2$.

31. The method of claim 14 further comprising repeating steps (a)–(c) any number of times prior to performing step (d).

32. The method of claim 14 wherein said annealing is performed at a temperature of about 1300° C. or greater, but less than the melting point of Si which is 1415° C., for a time period of about 2 hours or greater.

33. The method of claim 14 wherein said annealing ambient comprises 100% pure oxygen.

34. The method of claim 14 wherein said annealing ambient comprises oxygen admixed with an inert gas or nitrogen or both.

35. The method of claim 14 wherein said annealing ambient comprises an inert gas or nitrogen or a mixture of both.

36. The method of claim 14 wherein said annealing ambient is in vacuum.

37. A method of forming a semiconductor composite structure containing buried SON structures, said method comprising the steps of:
   (i) forming a patterned mask of HF-resistant photoresist atop a semiconductor wafer, said patterned mask having one or more openings that expose portions of said semiconductor wafer;
   (ii) forming porous Si in surface regions of said exposed portions of said semiconductor wafer;
   (iii) removing said patterned mask;
   (iv) forming epi-Si atop the wafer including said porous Si; and
   (v) annealing the wafer at an elevated temperature which causes transformation of the porous Si into buried void planes.

38. A method of forming a semiconductor composite structure containing buried layers of insulator/void plane structures side-by-side, conductor/void plane structures side-by-side, and void plane structures alone comprising the following processes, conducted in any order:
   (A) providing insulator/void plane or conductor/void structures utilizing the steps of:
      (a) forming a layer of porous Si in a surface region of a semiconductor wafer;
      (b) forming an epi-Si layer on the layer of porous Si, wherein an interface exists between the epi-Si layer and the layer of porous Si;

(c) selectively implanting ions into predetermined areas of the wafer to form implant regions at or near said interface; and (B) providing void planes utilizing the steps of:

(i) forming a patterned mask of HF-resistant photoresist atop a semiconductor wafer, said patterned mask having one or more openings that expose portions of said semiconductor wafer;

(ii) forming porous Si in surface regions of said exposed portions of said semiconductor wafer;

(iii) removing said patterned mask;

(iv) forming epi-Si atop the wafer including said porous Si; and (C) annealing the wafer at an elevated temperature.

* * * * *